United States Patent
Lin et al.

(10) Patent No.: US 9,129,707 B2
(45) Date of Patent: Sep. 8, 2015

(54) DUAL PORT SRAM WITH DUMMY READ RECOVERY

(71) Applicant: Taiwan Semiconductor Manufacturing Co., Ltd., Hsin-Chu (TW)

(72) Inventors: Kao-Cheng Lin, Taipei (TW); Wei Min Chan, Sindian (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 51 days.

(21) Appl. No.: 14/043,869

(22) Filed: Oct. 2, 2013

(65) Prior Publication Data

US 2015/0092476 A1    Apr. 2, 2015

(51) Int. Cl.
*G11C 8/16* (2006.01)
*G11C 11/419* (2006.01)
*G11C 7/10* (2006.01)
*G11C 11/412* (2006.01)

(52) U.S. Cl.
CPC ............ *G11C 11/419* (2013.01); *G11C 7/1075* (2013.01); *G11C 11/412* (2013.01)

(58) Field of Classification Search
CPC ....... G11C 8/16; G11C 7/1075; G11C 11/412
USPC ........................................ 365/189.04, 230.05
See application file for complete search history.

(56) References Cited

U.S. PATENT DOCUMENTS 8,189,368 B2    5/2012    Liaw
8,295,099 B1 *  10/2012   Yachareni et al. ....... 365/189.04
8,582,389 B2 *  11/2013   Gajjewar et al. ........ 365/230.05

* cited by examiner

*Primary Examiner* — Son Mai
(74) *Attorney, Agent, or Firm* — Duane Morris LLP

(57) ABSTRACT

An integrated includes a dual port memory cell such as a SRAM cell. A first port dummy read recovery block couples the first port complementary bit line to a high voltage supply node during a write logic low operation to the data node through the second port bit line, and couples the first port bit line to a high voltage supply node during a write logic low operation to the complementary data node through the second port complementary bit line. A second port dummy read recovery block couples the second port complementary bit line to a high voltage supply node during a write logic low operation to the data node through the first port bit line, and couples the second port bit line to a high voltage supply node during a write logic low operation to the complementary data node through the first port complementary bit line.

20 Claims, 6 Drawing Sheets

DUAL PORT SRAM WITH DUMMY READ RECOVERY

BACKGROUND

Static random access memories (SRAM) are commonly used in integrated circuits. Embedded SRAM is particularly popular in high speed communication, image processing and system-on-chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single port SRAM cell. Another type of SRAM cell is referred to as a dual port SRAM cell, which includes four pass-gate transistors. With two ports, the bit stored in the SRAM cell can be read from port-A and port-B simultaneously. This allows for parallel operations by different applications. Moreover, if a first SRAM cell and a second SRAM cell are in a same column or a same row, a read operation from the first SRAM cell can also be performed simultaneously with a write operation to the second SRAM cell.

As timing and voltage margins have reduced, operational errors can occur. One type of error is called "read-disturb-write". Assume for example a first SRAM cell in a row is being written to on Port A. If the Port B word line is active, for example so that a read or write operation can occur to the Port B of a second cell, then the Port B of the first cell is under a "dummy read" condition. This dummy read condition may induce error in the write operation to the Port A of the first SRAM cell.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
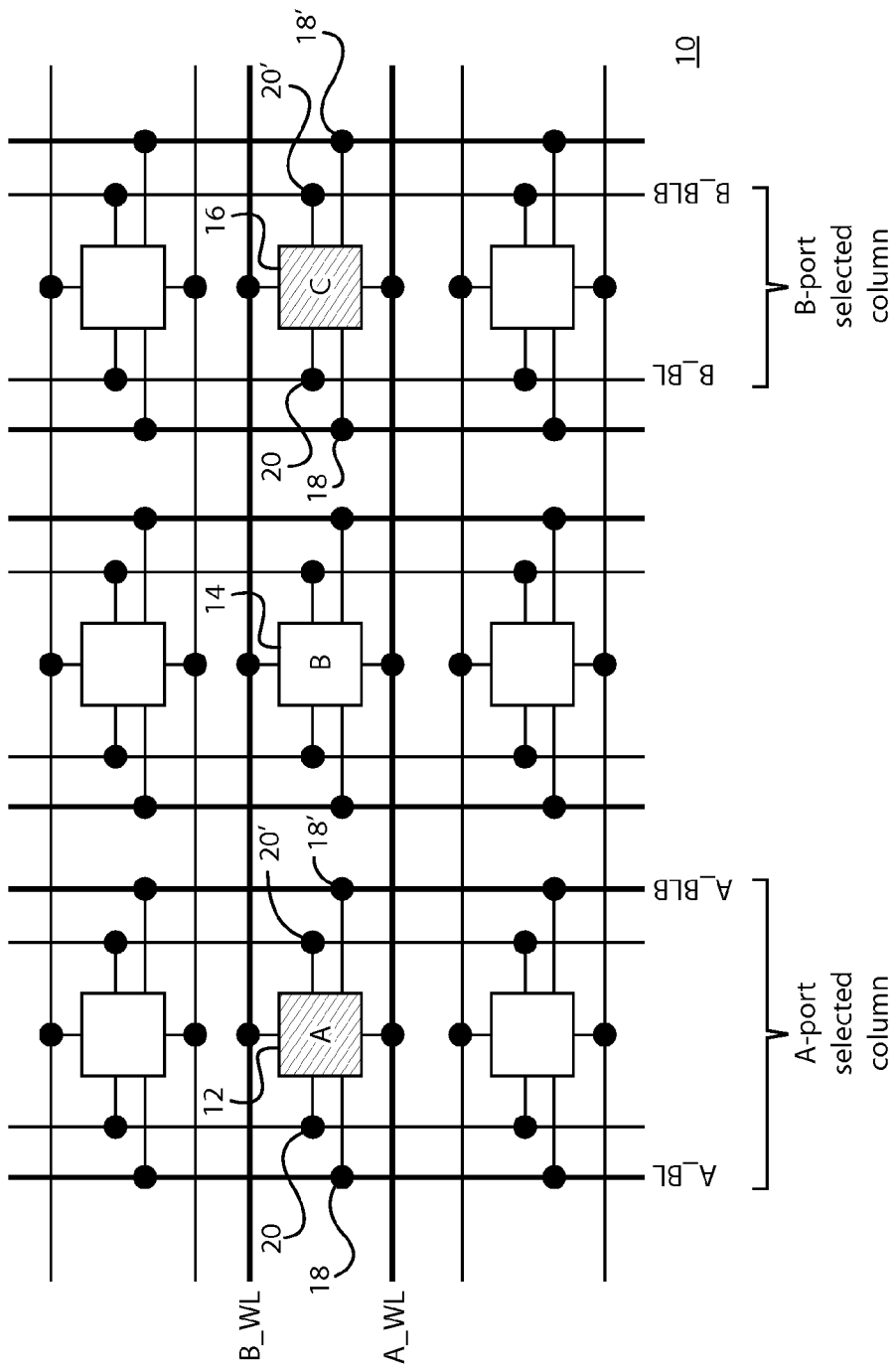
FIG. 1 illustrates a portion of a SRAM array.

FIG. 1 illustrates a portion of a SRAM array, specifically a portion containing a 3×3 matrix of SRAM cells. With particularly attention to one row, the middle row of SRAM cells includes SRAM cell 12 (labeled A), SRAM cell 14 (labeled B) and SRAM cell 16 (labeled C). Each SRAM cell is a dual port cell and thus includes an A port 18 (and its logical inverse (complement) labeled 18') and a B port 20 (and its logical inverse labeled 20'). The A ports 18, 18' are coupled to the A-port bit lines labeled A_BL and A_BLB, respectively. Similarly, the B ports 20, 20' are coupled to the B-port bit lines labeled B_BL and B_BLB, respectively. Each SRAM cell is also connected to a respective A-port word line (labeled A_WL) and B-port word line (labeled B_WL). The above-described "read-disturb-write" error can occur when both A_WL and B_WL are simultaneously active, which is the default operation for dual port SRAMs. Specifically, assume a write operation to the A-Port 18 of SRAM cell 12 and read or write operation at the same time to the B-port 20 of the SRAM cell 16. In this case, both A_WL and B_WL must be active, which places the B-port 20 of the SRAM cell 12 in a "dummy read" condition, which can induce the A-port write failure. This is explained in more detail in connection with FIG. 2, which shows SRAM cell 12 in more detail and an operational timing diagram.

Figure 2:
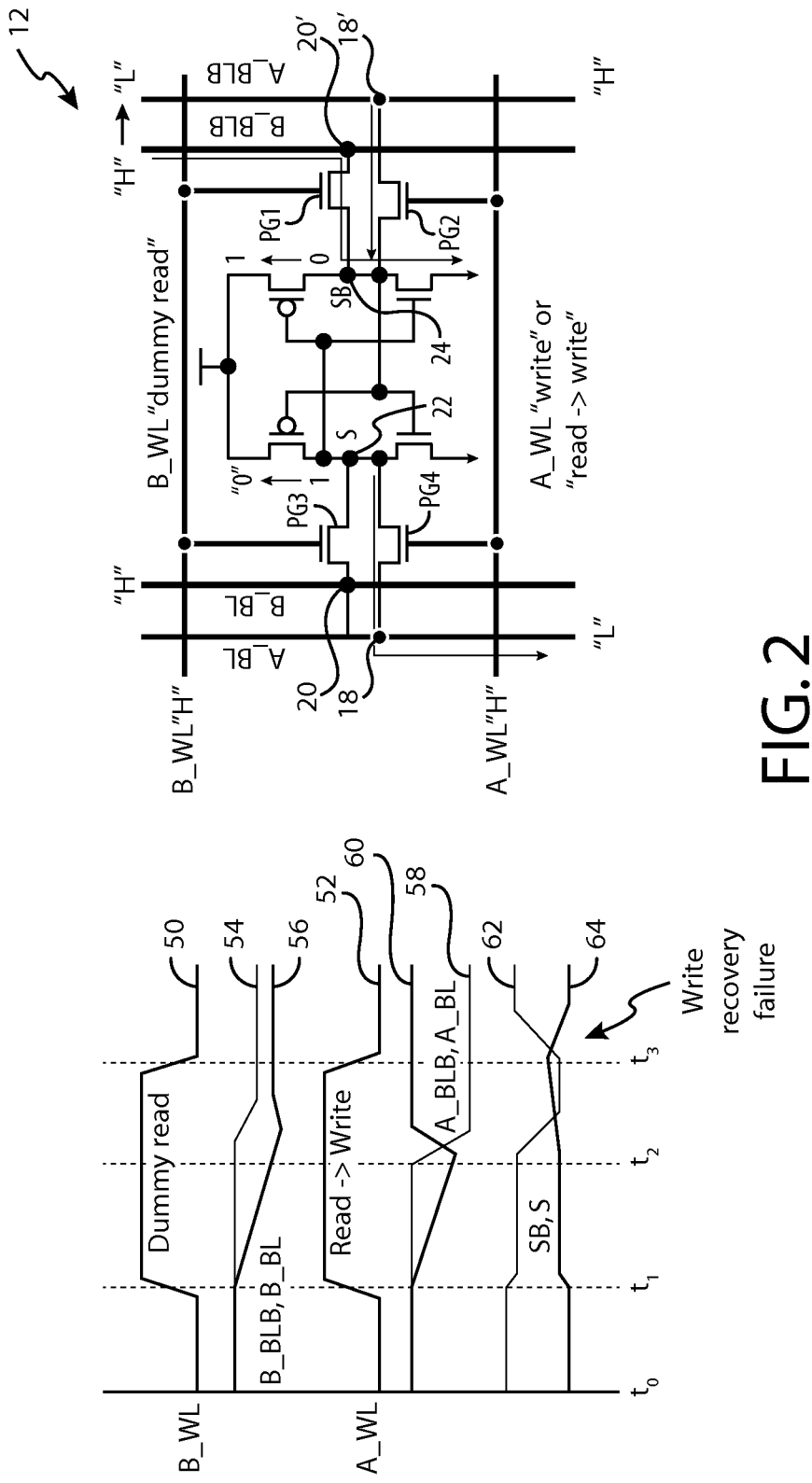
FIG. 2 illustrates in more detail a SRAM cell and a timing diagram illustrating the operation of same.

As can be seen from FIG. 2, the SRAM cell 12 is configured as a pair of cross-coupled inverters that operate to reinforce the data state stored therein. For example, internal node 22 (labeled S) can be considered the "true" (i.e., true data value) node, and internal node 24 (labeled SB) can be considered the complementary node. The inverters hold the complementary node SB at the opposite binary data state of the data state held at the true node S. The B_BLB line is connected to the complementary node SB through a first pass gate (access) transistor (PG1), which is controlled by B_WL. The A_BLB line is connected to the complementary node SB through a second pass gate transistor (PG2), which is controlled by A_WL. The B_BL line is connected to the true node S through a third pass gate transistor (PG3), which is controlled by B_WL. Finally, the A_BL line is connected to the true node S through a fourth pass gate transistor (PG4), which is controlled by A_WL.

As shown by waveform 50, B_WL is logical high from time t1 to t3, which represents the "dummy read" condition for the B-port, since both PG1 and PG2 are in the "on" state during the interval. As shown by waveform 52, the A-port signal A_WL is high during the same time, with a read operation occurring during the t1 to t2 interval and a write operation following during the t2 to t3 interval. A_BL, B_BL, A_BLB and B_BLB are all precharged to Vdd (time to t0 to t1). Assuming a WRITE 0 on port A, then A_BLB is at Vdd to write a 1 value at node SB. However, B_BLB, which is still connected to ground through pass gate transistor PG1 while the B_WL signal is high, presents a large discharged capacitance load that interferes with the WRITE operation. This can cause a write margin error while writing a 0 from Port A because charge flows from A_BLB onto B_BLB rather than lifting the voltage at the complementary node SB to a logical 1. It should be understood that while explained in connection with writing a "0" to Port A, the write margin error can occur when writing a "0" (S from "1" to "0" and SB from "0" to "1") or writing a "1" (S from "0" to "1" and SB from "1" to "0").

In the timing diagram, waveform 54 represents B_BL; waveform 56 represents B_BLB; waveform 58 represents A_BL; waveform 60 represents A_BLB; waveform 62 represents true node S; and waveform 64 represents complementary node SB. As can be seen in the diagram, during the write period, A_BL goes low with A_BLB going high to WRITE 0. During this time period, B_BLB (waveform 56) stays low. True node S (waveform 62) goes low but complementary node SB remains relatively low at time t3. With SB low when A_WL and B_WL go low (right after t3), the low state of SB can cause a flip in the logic stage of true node S to logic 1, which is a write error.

Figure 3:
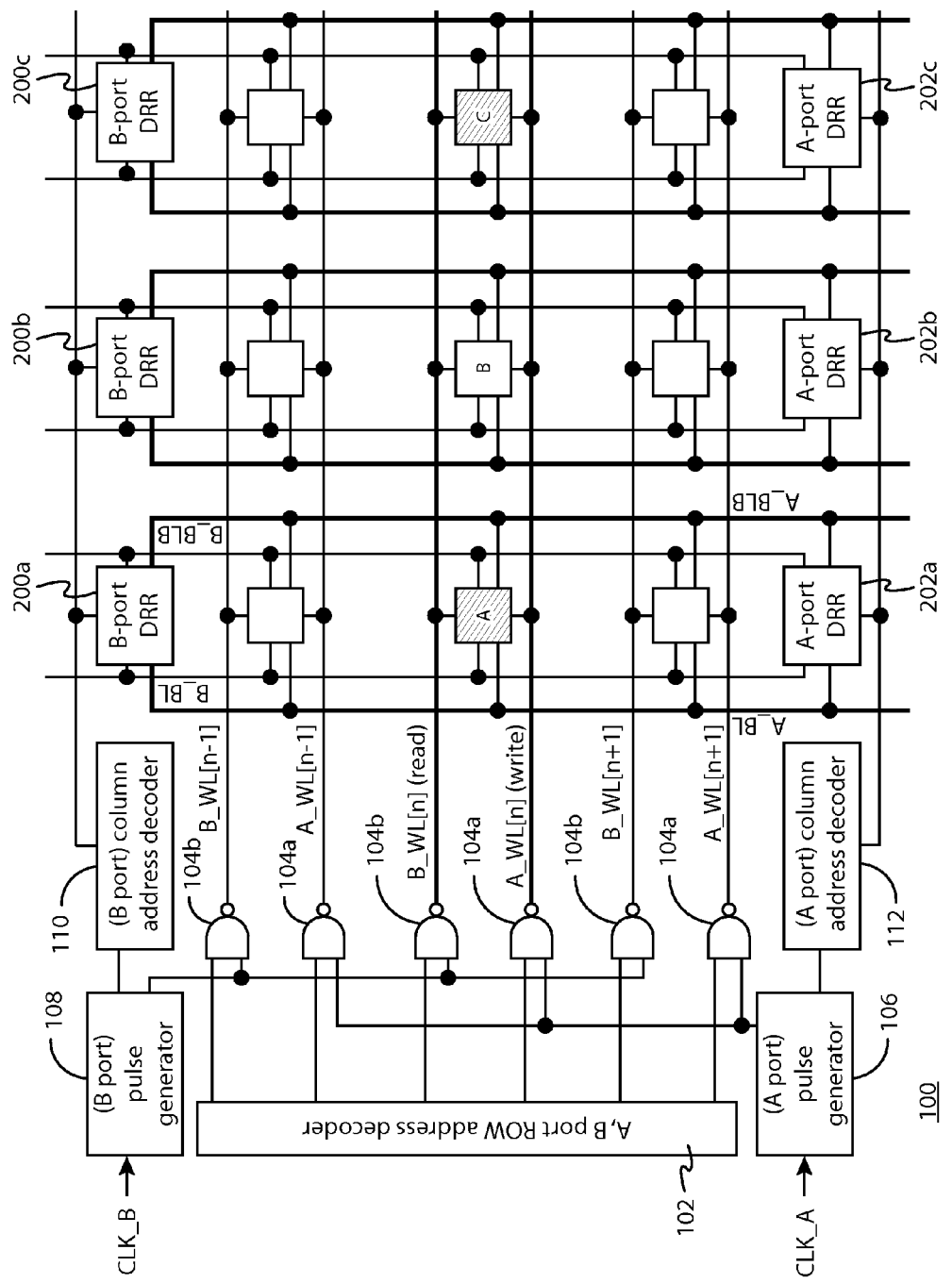
FIG. 3 illustrates a SRAM array having A-port and B-port dummy read recovery circuits for providing write assist.

FIG. 3 illustrates a SRAM memory 100 of conventional design except for the addition of respective B-port Dummy Read Recovery (DRR) Blocks 200 and respective A-port DRR blocks 202 associated with each column of SRAM cells. The SRAM includes several illustrated components familiar to those in the art, which will be listed but not discussed in detail so as to avoid obscuring the present disclosure. The SRAM 100 includes a row decoder 102 coupled to the A and B word lines (three of which are illustrated) through respective NAND gates 104. The NAND gates 104a are connected to the A-port word lines and also each have an input coupled to the A-port pulse generator 106. Likewise, the NAND gates 104b are connected to the B-port word lines and also have an input connected to the B-port pulse generator 108. The output of the NAND gates 104 are the A_WL and B_WL enable signals discussed above in connection with FIGS. 1 and 2. The B-port and A-port pulse generators 108, 106 are also coupled to the B-port and A-port column address decoders 110, 112 respectively. The outputs of the B-port column address decoder and A-port column address decoder are provided to the B-port DRRs and A-port DRRs 200, 202 respectively.

Figure 4:
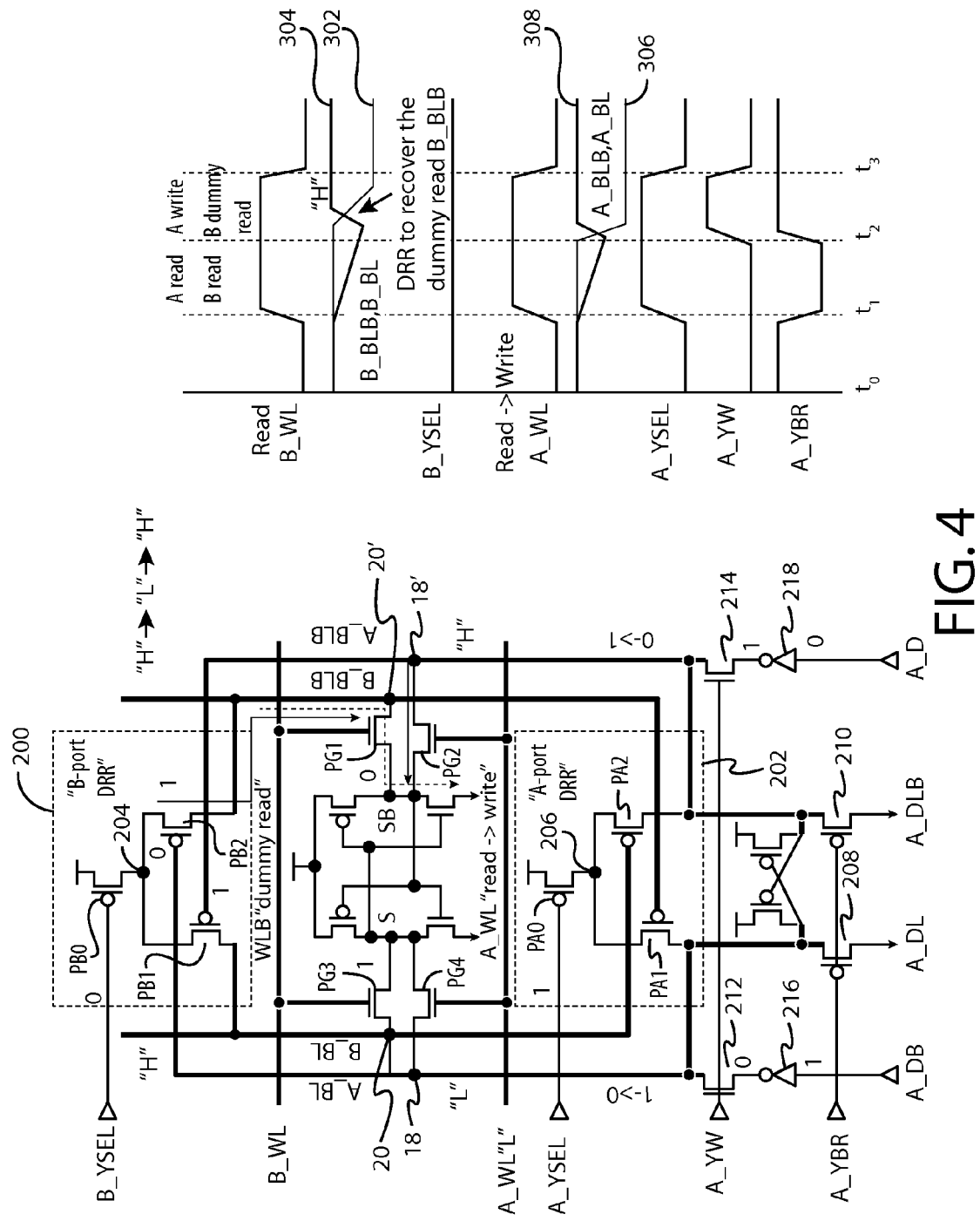
FIG. 4 illustrates in more detail an embodiment of the A-port and B-port dummy read recovery circuits coupled to a SRAM cell and a timing diagram illustrating operation of the SRAM.

Turning to FIG. 4, FIG. 4 illustrates a single SRAM cell of FIG. 3 connected to an embodiment of the B-port DRR 200 and A-port DRR 202. Nodes and transistors of the SRAM cell are labeled as shown in FIG. 2. Signal B_YSEL is the output of the B-port column address decoder 110 of FIG. 3, and signal A_YSEL is the output of the A-port column address decoder 112 of FIG. 3. The A_WL and B_WL signals are provided by the NAND gates 104a and 104b of FIG. 3. A-port and B-port bit line and complementary bit lines (signals) are coupled to true data nodes 18, 20 and complementary data nodes 18', 20', respectively, through the illustrated access transistors PG1 to PG4.

In the illustrated embodiment, the B-port DRR 200 includes three PMOS transistors PB0, PB1 and PB2. Transistor PB0 is a selection transistor controlled by the B-port column selection signal and is coupled between the high supply voltage (Vdd) and internal node 204. This transistor is "on" (conducting) when B_YSEL is enabled (logic 0). PMOS transistor PB1 is coupled between node 204 and the B-port bit line node 20 (B_BL) and controlled at its gate by the A-port complementary bit line node 18' (A_BLB). Conversely, PMOS transistor PB2 is coupled between node 204 and the B-port complementary bit line node 20' (B_BLB) and controlled at its gate by the A-port bit line node 18 (A_BL).

The A-port DRR 202 also includes three PMOS transistors PA0, PA1 and PA2. Transistor PA0 is controlled by the A-port column selection signal and is coupled between the high supply voltage (Vdd) and internal node 206. This transistor is "on" (conducting) when A_YSEL is enabled (logic 0). PMOS transistor PA1 is coupled between node 206 and the A-port bit line node 18 (A_BL) and controlled at its gate by the B-port complementary bit line node 20' (B_BLB). Conversely, PMOS transistor PA2 is coupled between node 206 and the A-port complementary bit line node 18' (A_BLB) and controlled at its gate by the B-port bit lien node 20 (B_BL).

The timing diagram included with FIG. 4 illustrates the operation of the DRR circuits of FIG. 4. Assume at time t1 that the signal A_YSEL is high and the B_YSEL signal is low (i.e., the A-port is selected for a read or write operation and the B-port is not selected). This condition enables the B-port DRR 200, i.e., PB0 is on, and disables the A-port DRR 202, i.e., PA0 is off. Word line enable signals A_WL and B_WL are high from time t1 to time t3, which turns on all access transistors PG1 to PG4. A read operation on port A occurs from time t1 to time t2. Read control signal A_YBR goes low during this time period, which turns on PMOS transistors 208, 210. True A-port data node S and complementary data node SB are read out as differential A-port data signals A_DL and A_DLB from nodes 18 and 18', respectively. Signals A_BL (306) and A_BLB (308) are initially charged to VDD, and from time t1 to t2 A_BL remains at VDD while A_BLB is driven towards ground. It should be apparent that this represents a logic "1" stored at true data node S (with logic "0" at complementary data node SB'). B-port signals B_BL (302) and B_BLB (304) track the A-port signals during the read operation.

The A-port write operation follows during time t2 to t3. At the conclusion of the read operation (time t2) read control signal A_YBR goes high to turn off PMOS transistors 208, 210. Write control signal A_YW goes high, turning on NMOS transistors 212, 214. Assume a logic "0" is to be written into the SRAM (i.e., to true data node S through node 18), then complementary write data signal A_DB is a logic 1, which is inverted by inverter 216, and write data signal A_D is logic 0, which is inverted by inverter 218. During the A-port write operation, A_BL (306) is pulled low and A_BLB (308) is driven high. With A_BL low and A_BLB high, PB2 is on and PB1 is off, respectively. With PB2 on, B_BLB (304) is clamped to VDD. This operation mitigates the dummy read disturbance.

It should be understood that if a "1" were being written to port A, then a "0" would be written to the complementary node. As such, PB1 would be operational and PB2 would be off. This would drive B_BL to Vdd and mitigate dummy read disturbance to writing the 0 to the complementary node of Port-A.

It should be understood that A-port DRR 202 operates in the same manner as B-port DRR 200 to mitigate dummy read disturbance when the write operation is performed on the B-port with the A-port word line in "dummy read".

Figure 5:
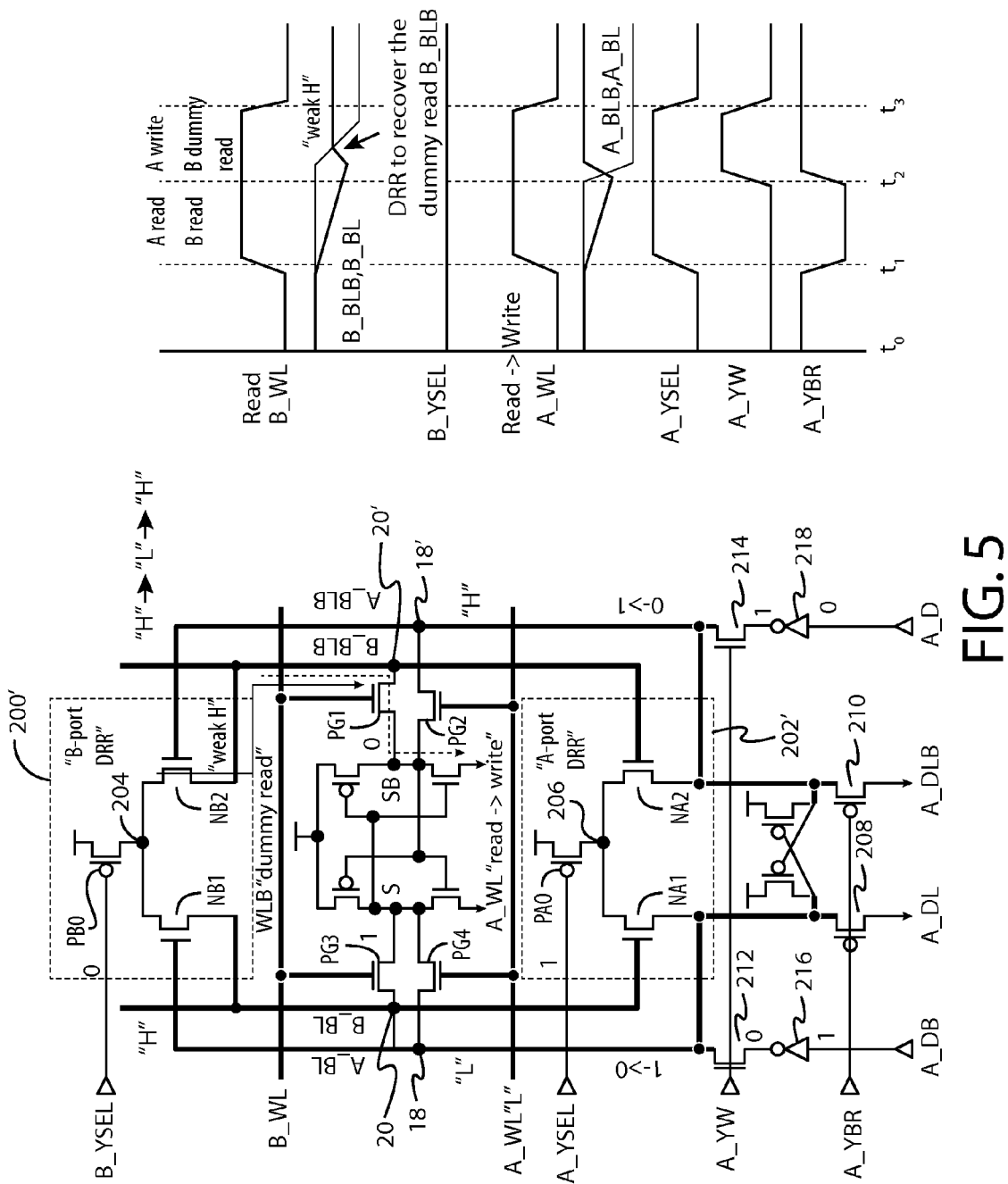
FIG. 5 illustrates in more detail a second embodiment of the A-port and B-port dummy read recovery circuits coupled to a SRAM cell and a timing diagram illustrating operation of the SRAM.

FIG. 5 illustrates an alternative embodiment of a SRAM. The SRAM is identical to that of FIG. 4 only B-port DRR 200' and A-port DRR 202' are substituted. These DRR circuits use NMOS transistors NB1, NB2 and NA1, NA2 rather than PMOS transistors. As such, NB1 is controlled by A-port bit line signal A_BL and transistor NB2 is controlled by complementary A-port bit line signal A_BLB. Transistor NA1 is controlled by B-port bit line signal B_BL and transistor NA2 is controlled by complementary B-port bit line signal B_BLB. The operation of the SRAM is identical to that described above in connection with FIG. 4, only during the write operation between times t2 to t3, B_BLB is driven to a weak high (i.e., VDD-Vt (of NB2)).

Figure 6:
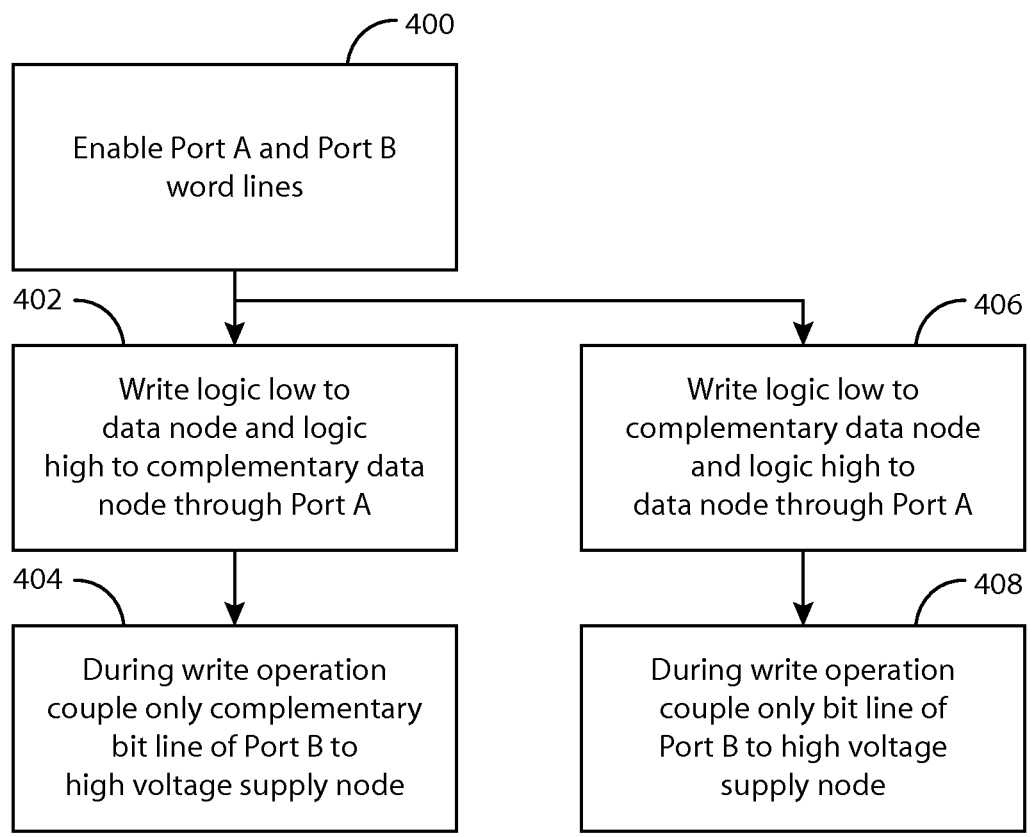
FIG. 6 is a flow diagram illustrating the operation of SRAM cell with dummy read recovery.

FIG. 6 illustrates a method of writing data to a dual port memory cell, such as a SRAM cell. At step 400, Port A and Port B word line connected to a memory cell are enabled. At step 402, logic low (0) is written to the data node and logic high is written to the complementary data node of the SRAM cell through Port A. At step 404, during the write operation, only the Port B complementary bit line (from the Port B bit line and complementary bit line) is coupled to the high voltage supply node. At step 406, logic low (0) is written to the complementary data node and logic high is written to the data node of the SRAM cell through Port A. At step 408, during the write operation, only the Port B bit line (from the Port B bit line and complementary bit line) is coupled to the high voltage supply node.

In one disclosed embodiments, an integrated includes a first port word line; a second port word line; a first port bit line and a first port complementary bit line; a second port bit line and a second port complementary bit line; a dual port memory cell having a data node coupled to the first and second port bit lines under control of the first and second port word lines and a complementary data node coupled to the first and second port complementary bit lines under control of the first and second port word lines; a first port dummy read recovery block configured to couple the first port complementary bit line to a high voltage supply node during a write logic low operation to the data node of the memory cell through the second port bit line, and to couple the first port bit line to a high voltage supply node during a write logic low operation to the complementary data node of the memory cell through the second port complementary bit line; and a second port dummy read recovery block configured to couple the second port complementary bit line to a high voltage supply node during a write logic low operation to the data node of the memory cell through the first port bit line, and to couple the second port bit line to a high voltage supply node during a write logic low operation to the complementary data node of the memory cell through the first port complementary bit line.

In some embodiments, the first port dummy read recovery block is configured to be enabled during the second port write operation and disabled during the first port write operation, and the second port dummy read recovery block is configured to be enabled during the first port write operation and disabled during the second port write operation.

In some embodiments, the first and second port dummy read recovery blocks each includes a selection transistor responsive to a column selection signal.

In some embodiments, the first port dummy read recovery block includes a selection transistor coupling a first port dummy read recovery internal node to the high supply voltage node, a first transistor coupling the internal node to the first port bit line and a second transistor coupling the internal node to the first port complementary bit line, and the second port dummy read recovery block includes a selection transistor coupling a second port dummy read recovery internal node to the high supply voltage node, a first transistor coupling the internal node to the second port bit line and a second transistor coupling the internal node to the second port complementary bit line.

In some embodiments, when the first port dummy read recovery internal node is coupled to the high supply voltage node through the first port dummy read recovery block selection transistor, only one of the first and second transistors of the first port dummy read recovery block is on, and when the second port dummy read recovery internal node is coupled to the high supply voltage node through the second port dummy read recovery block selection transistor, only one of the first and second transistors of the second port dummy read recovery block is on.

In some embodiments, the first and second transistors of the first port dummy read recovery block are PMOS transistors, and the first transistor has a gate terminal coupled to the second port complementary bit line and the second transistor has a gate terminal coupled to the second port bit line, and the first and second transistors of the second port dummy read recovery block are PMOS transistors, and the first transistor has a gate terminal coupled to the first port complementary bit line and the second transistor has a gate terminal coupled to the first port bit line.

In some embodiments, the first and second transistors of the first port dummy read recovery block are NMOS transistors, and the first transistor has a gate terminal coupled to the second port bit line and the second transistor has a gate terminal coupled to the second port complementary bit line, and the first and second transistors of the second port dummy read recovery block are NMOS transistors, and the first transistor has a gate terminal coupled to the first port bit line and the second transistor has a gate terminal coupled to the first port complementary bit line.

In some embodiments, the integrated circuit includes a plurality of memory cells arranged in a matrix of rows and columns, wherein each column of memory cells has a first port dummy read recovery block and second port dummy read recovery block connected thereto.

In some embodiments, the dual port memory cell is a dual port SRAM cell.

In another embodiment of an integrated circuit, the integrated circuit comprises a first port word line; a second port word line; a first port bit line and a first port complementary bit line; a second port bit line and a second port complementary bit line; a dual port SRAM cell having a data node coupled to the first and second port bit lines under control of the first and second port word lines and a complementary data node coupled to the first and second port complementary bit lines under control of the first and second port word lines; and a dummy read recovery block configured to couple the second port complementary bit line to a high voltage supply node during a write logic low operation to the data node of the SRAM cell through the first port bit line, and to couple the second port bit line to a high voltage supply node during a write logic low operation to the complementary data node of the SRAM cell through the first port complementary bit line, wherein only one of the second port bit line and second port complementary bit line is coupled to the high voltage supply node during a given write logic low operation.

In some embodiments, the dummy read recovery block is configured to be enabled during the first port write operation and disabled during a second port write operation.

In some embodiments, the dummy read recovery block includes a selection transistor responsive to a column selection signal.

In some embodiments, the dummy read recovery block includes a selection transistor coupling a dummy read recovery internal node to the high supply voltage node, a first transistor coupling the internal node to the second port bit line and a second transistor coupling the internal node to the second port complementary bit line.

In some embodiments, when the internal node is coupled to the high supply voltage node through the selection transistor, only one of the first and second transistors is on.

In some embodiments, the first and second transistors are PMOS transistors, and the first transistor has a gate terminal coupled to the first port complementary bit line and the second transistor has a gate terminal coupled to the first port bit line.

In some embodiments, the first and second transistors are NMOS transistors, and the first transistor has a gate terminal coupled to the first port bit line and the second transistor has a gate terminal coupled to the first port complementary bit line.

In some embodiments, the integrated circuit includes a plurality of SRAM cells arranged in a matrix of rows and columns, wherein each column of SRAM cells has a dummy read recovery block connected thereto.

In one embodiment of a method of writing data to a dual port memory cell such as a dual port SRAM cell of an integrated circuit, where the memory cell has a data node coupled to first and second port bit lines under control of first and second port word lines and a complementary data node coupled to first and second port complementary bit lines under control of first and second port word lines comprising, the method includes the steps of: enabling both the first and second port word lines; writing a low voltage to the data node and a high voltage to the complementary data node through the first port bit line and first port complementary bit line, respectively; and during the writing step, coupling only the second port complementary bit line from the second port bit line and second port complementary bit line to a high voltage supply node.

In some embodiments, the method further comprises the steps of: writing a low voltage to the complementary data node and a high voltage to the data node through the first port complementary bit line and first port bit line, respectively; and during the writing step, coupling only the second port bit line from the second port bit line and second port complementary bit line to a high voltage supply node.

In some embodiments, the writing step occurs during a clock cycle and is preceded by a read operation from the SRAM cell during the clock cycle.

Although examples are illustrated and described herein, embodiments are nevertheless not limited to the details shown, since various modifications and structural changes may be made therein by those of ordinary skill within the scope and range of equivalents of the claims.

What is claimed is:

1. An integrated circuit, comprising:
a first port word line;
a second port word line;
a first port bit line and a first port complementary bit line;
a second port bit line and a second port complementary bit line;
a dual port memory cell having a data node coupled to the first and second port bit lines under control of the first and second port word lines and a complementary data node coupled to the first and second port complementary bit lines under control of the first and second port word lines;
a first port dummy read recovery block configured to couple the first port complementary bit line to a high voltage supply node during a write logic low operation to the data node of the memory cell through the second port bit line, and to couple the first port bit line to a high voltage supply node during a write logic low operation to the complementary data node of the memory cell through the second port complementary bit line; and
a second port dummy read recovery block configured to couple the second port complementary bit line to a high voltage supply node during a write logic low operation to the data node of the memory cell through the first port bit line, and to couple the second port bit line to a high voltage supply node during a write logic low operation to the complementary data node of the memory cell through the first port complementary bit line.

2. The integrated circuit of claim 1,
wherein the first port dummy read recovery block is configured to be enabled during the second port write operation and disabled during the first port write operation, and
wherein the second port dummy read recovery block is configured to be enabled during the first port write operation and disabled during the second port write operation.

3. The integrated circuit of claim 2, wherein the first and second port dummy read recovery blocks each includes a selection transistor responsive to a column selection signal.

4. The integrated circuit of claim 1,
wherein the first port dummy read recovery block includes a selection transistor coupling a first port dummy read recovery internal node to the high supply voltage node, a first transistor coupling the internal node to the first port bit line and a second transistor coupling the internal node to the first port complementary bit line, and
wherein the second port dummy read recovery block includes a selection transistor coupling a second port dummy read recovery internal node to the high supply voltage node, a first transistor coupling the internal node to the second port bit line and a second transistor coupling the internal node to the second port complementary bit line.

5. The integrated circuit of claim 4,
wherein when the first port dummy read recovery internal node is coupled to the high supply voltage node through the first port dummy read recovery block selection transistor, only one of the first and second transistors of the first port dummy read recovery block is on, and
wherein when the second port dummy read recovery internal node is coupled to the high supply voltage node through the second port dummy read recovery block selection transistor, only one of the first and second transistors of the second port dummy read recovery block is on.

6. The integrated circuit of claim 4,
wherein the first and second transistors of the first port dummy read recovery block are PMOS transistors, and the first transistor has a gate terminal coupled to the second port complementary bit line and the second transistor has a gate terminal coupled to the second port bit line, and
wherein the first and second transistors of the second port dummy read recovery block are PMOS transistors, and the first transistor has a gate terminal coupled to the first port complementary bit line and the second transistor has a gate terminal coupled to the first port bit line.

7. The integrated circuit of claim 4,
wherein the first and second transistors of the first port dummy read recovery block are NMOS transistors, and the first transistor has a gate terminal coupled to the second port bit line and the second transistor has a gate terminal coupled to the second port complementary bit line, and
wherein the first and second transistors of the second port dummy read recovery block are NMOS transistors, and the first transistor has a gate terminal coupled to the first port bit line and the second transistor has a gate terminal coupled to the first port complementary bit line.

8. The integrated circuit of claim 1, wherein the integrated circuit includes a plurality of memory cells arranged in a matrix of rows and columns, wherein each column of memory cells has a first port dummy read recovery block and second port dummy read recovery block connected thereto.

9. The integrated circuit of claim 1, wherein the dual port memory cell is a dual port SRAM cell.

10. An integrated circuit, comprising:
a first port word line;
a second port word line;
a first port bit line and a first port complementary bit line;
a second port bit line and a second port complementary bit line;

a dual port SRAM cell having a data node coupled to the first and second port bit lines under control of the first and second port word lines and a complementary data node coupled to the first and second port complementary bit lines under control of the first and second port word lines; and a dummy read recovery block configured to couple the second port complementary bit line to a high voltage supply node during a write logic low operation to the data node of the SRAM cell through the first port bit line, and to couple the second port bit line to a high voltage supply node during a write logic low operation to the complementary data node of the SRAM cell through the first port complementary bit line, wherein only one of the second port bit line and second port complementary bit line is coupled to the high voltage supply node during a given write logic low operation.

11. The integrated circuit of claim 10, the dummy read recovery block is configured to be enabled during the first port write operation and disabled during a second port write operation.

12. The integrated circuit of claim 11, wherein the dummy read recovery block includes a selection transistor responsive to a column selection signal.

13. The integrated circuit of claim 10, wherein the dummy read recovery block includes a selection transistor coupling a dummy read recovery internal node to the high supply voltage node, a first transistor coupling the internal node to the second port bit line and a second transistor coupling the internal node to the second port complementary bit line.

14. The integrated circuit of claim 13, wherein when the internal node is coupled to the high supply voltage node through the selection transistor, only one of the first and second transistors is on.

15. The integrated circuit of claim 13, wherein the first and second transistors are PMOS transistors, and the first transistor has a gate terminal coupled to the first port complementary bit line and the second transistor has a gate terminal coupled to the first port bit line.

16. The integrated circuit of claim 13, wherein the first and second transistors are NMOS transistors, and the first transistor has a gate terminal coupled to the first port bit line and the second transistor has a gate terminal coupled to the first port complementary bit line.

17. The integrated circuit of claim 10, wherein the integrated circuit includes a plurality of SRAM cells arranged in a matrix of rows and columns, wherein each column of SRAM cells has a dummy read recovery block connected thereto.

18. A method of writing data to a dual port SRAM memory cell of an integrated circuit, the SRAM memory cell having a data node coupled to first and second port bit lines under control of first and second port word lines and a complementary data node coupled to first and second port complementary bit lines under control of first and second port word lines, the method comprising the steps of:

enabling both the first and second port word lines;

writing a low voltage to the data node and a high voltage to the complementary data node through the first port bit line and first port complementary bit line, respectively; and during the writing step, coupling only the second port complementary bit line selected from the second port bit line and the second port complementary bit line to a high voltage supply node.

19. The method of claim 18, further comprising the steps of:

writing a low voltage to the complementary data node and a high voltage to the data node through the first port complementary bit line and first port bit line, respectively; and during the writing step, coupling only the second port bit line selected from the second port bit line and the second port complementary bit line to a high voltage supply node.

20. The method of claim 18, wherein the writing step occurs during a clock cycle and is preceded by a read operation from the SRAM cell during the clock cycle.

* * * * *